United States Patent
Kuebrich et al.

(10) Patent No.: US 8,605,465 B2
(45) Date of Patent: Dec. 10, 2013

(54) METHODS OF CONTROLLING A SYNCHRONOUS RECTIFIER

(75) Inventors: Johann Baptist Daniel Kuebrich, Schlüsselfeld (DE); Markus Schmid, Jettingen-Scheppach (DE); Thomas Antonius Duerbaum, Baiersdorf (DE); Frans Pansier, Nuenen (NL); Gian Hoogzaad, Mook (NL); Hans Halberstadt, Groesbeek (NL)

(73) Assignee: NXP B.V., Eindhoven (NL)

(*) Notice: Subject to any disclaimer, the term of this patent is extended or adjusted under 35 U.S.C. 154(b) by 122 days.

(21) Appl. No.: 12/960,332

(22) Filed: Dec. 3, 2010

(65) Prior Publication Data

US 2011/0193612 A1 Aug. 11, 2011

(30) Foreign Application Priority Data

Dec. 4, 2009 (EP) .................. 09178092

(51) Int. Cl.
*H02M 3/335* (2006.01)

(52) U.S. Cl.
USPC ............ 363/21.06; 327/552

(58) Field of Classification Search
USPC ......... 363/21.06, 21.14, 127; 323/224, 282, 323/283, 284, 286; 327/552, 553, 554, 555, 327/556, 557, 558, 559
See application file for complete search history.

(56) References Cited

U.S. PATENT DOCUMENTS

| | | | | |
|---|---|---|---|---|
| 4,311,491 A * | 1/1982 | Bibbo et al. | | 95/7 |
| 4,807,642 A * | 2/1989 | Brown | | 600/546 |
| 4,864,167 A | 9/1989 | McKibben et al. | | |
| 5,173,847 A * | 12/1992 | Suzuki | | 363/21.14 |
| 5,315,164 A * | 5/1994 | Broughton | | 327/175 |
| 6,424,207 B1 * | 7/2002 | Johnson | | 327/552 |
| 6,674,658 B2 * | 1/2004 | Mao et al. | | 363/127 |
| 6,707,690 B1 * | 3/2004 | Bottrill | | 363/21.16 |
| 7,911,264 B2 * | 3/2011 | Hallak | | 327/552 |
| 2002/0097589 A1 | 7/2002 | Jansen et al. | | |
| 2008/0106229 A1 | 5/2008 | Kosaka et al. | | |
| 2008/0211473 A1 * | 9/2008 | Tlaskal et al. | | 323/283 |

FOREIGN PATENT DOCUMENTS

FR 2 861 915 A1 5/2005

OTHER PUBLICATIONS

Dianbo Fu, et al.: "IMHz High Efficiency LLC Resonant Converters with Synchronous Rectifier," Power Electronics Specialists Conf. IEEE pp. 2404-2410 (Jun. 17, 2007).
European Extended Search Report for Patent Appln. No. 09178092.4 (May 7, 2010).

* cited by examiner

*Primary Examiner* — Matthew Nguyen
*Assistant Examiner* — Alex Torres-Rivera (57) ABSTRACT

Consistent with an example embodiment, there is a method of controlling a synchronous rectifier having an input signal having oscillations therein and a switch which is switchable between an open state and a closed state. The method comprises filtering the input signal to produce a filtered signal, comparing the filtered signal with a reference value, and opening the switch in response to the comparison, in which the filtering is active filtering.

The active filtering may be based on determination of the peaks (positive and/or negative) of the signal, either directly, including a quarter period offset, or including decay—or a combination of the above; alternatively, the active filtering may be based on the a smoothing functions such as a switched low-pass filter or a short time integrator.

13 Claims, 7 Drawing Sheets

METHODS OF CONTROLLING A SYNCHRONOUS RECTIFIER

This application claims the priority under 35 U.S.C. §119 of European patent application no. 09178092.4, filed on Dec. 4, 2009, the contents of which are incorporated by reference herein.

This invention relates to methods of controlling synchronous rectifiers. It further relates to a computer program for operating such a method.

BACKGROUND

Synchronous rectification is a technique for improving efficiency of power converters in power electronics. It consists of connecting a transistor (typically a power MOSFET) and a diode (typically the body diode of the MOSFET) in parallel. When the diode would otherwise be forward-biased, the switching element is turned on, to reduce the voltage drop. When the diode would otherwise be reverse-biased, the transistor is turned off, so no current can flow through the parallel connection of switching element and diode. This way, a rectifying characteristic is obtained, without the forward voltage drop associated with diodes in the on-state.

The efficiency and effectiveness of synchronous rectification depends on the timing of the switching on and off of the transistor or switch. In particular, it is important that the switch is not turned off too late, lest current flows the wrong way past the rectifier. However, it is also important that the switch is not turned off too early, since this would result in less than ideal rectification, with associated losses. In comparison, for proper functioning, (though not necessarily for efficiency), the switch-on time is generally less critical.

The switching-off should be as close as possible to the zero crossing of the current through the rectifier. For the identification of the zero current state the small voltage drop across the channel of the switching element can be used, as it also can for the detection of the switch-on instant, although the voltage level is considerably lower for switch-off than the level for detection of the on-instant.

So, in order to ensure that reverse current does not flow through the rectifier, threshold voltages can be set to trigger switch-on (at 0.3V, say), and switch-off (typically at a much lower value, for instance at 10-40 mV).

However, the voltage signal seen by the comparator usually includes some parasitic oscillations caused by parasitic components. These include parasitic capacitances and inductances in the switch, the package and the layout. As a result, the signal usually has some superposed oscillations having an approximately fixed frequency which is dependant on the components and the layout. These oscillations will also be referred to hereinafter as ringings. Since the circuit is intentionally made low-resistance in order to minimise ohmic-losses, the ringings are only lightly, or weakly, damped.

Figure 1:
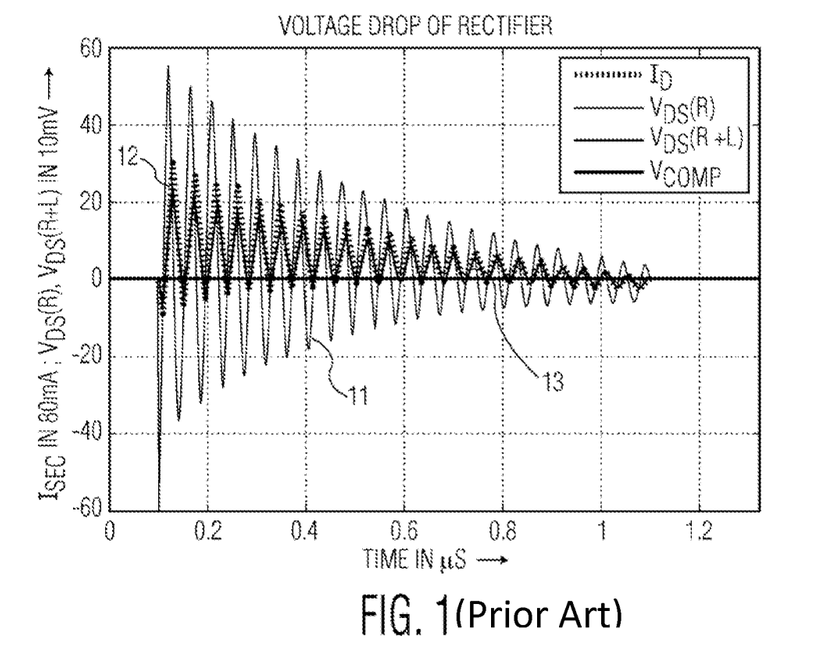
FIG. 1 shows a plot of the decay of the voltage across a synchronous rectifier, in an ideal case, with an ohmic loss in the rectifying switch, and with some reactance in the rectifying switch.

FIG. 1 shows the problems arising due to unavoidable oscillations in real applications. The figure shows as (feathered) curve 12 the secondary side current occurring if parasitic components are taken into account. This is a triangular falling current superimposed by a weakly damped high frequency oscillation. The better, or more low-ohmic, the synchronous rectification switch is, the less damped the oscillation becomes. Thus in typical synchronous rectification circuits the oscillation remains as long as the synchronour rectifier switch is closed—which in the case of a flyback corresponds to the secondary stroke.

Curve 13 demonstrates the sensed drain source voltage in case that no parasitic inductance due to the chip and the package is involved. This could be obtained by means of on-chip sensing (Kelvin-contacts). This represents the best case which can be obtained. Already in this case the synchronous rectification detection circuit would switch off the synchronous rectifier much too early since voltage across drain source crosses even the zero level indicated as green line.

Curve 11 depicts the more realistic case that typically occurs if driver and synchronous rectification switch are implemented into two packages. In this case additional package inductances provide additional voltages due to high frequency oscillating currents.

In order to realise the benefit of the synchronous rectification a very accurate detection of the turn-on and especially turn-off time instant is important.

In known synchronous rectifiers, passive filtering is applied in order to reduce the problem of early switch-off. In one such arrangement, leading edge blanking can be used to prevent a detection of the turn-off the signal, until a minimum time period has elapsed. However, if the oscillation is still present and not sufficiently damped the switch will be switched off too early (or, for low power output, too late).

Figure 2:
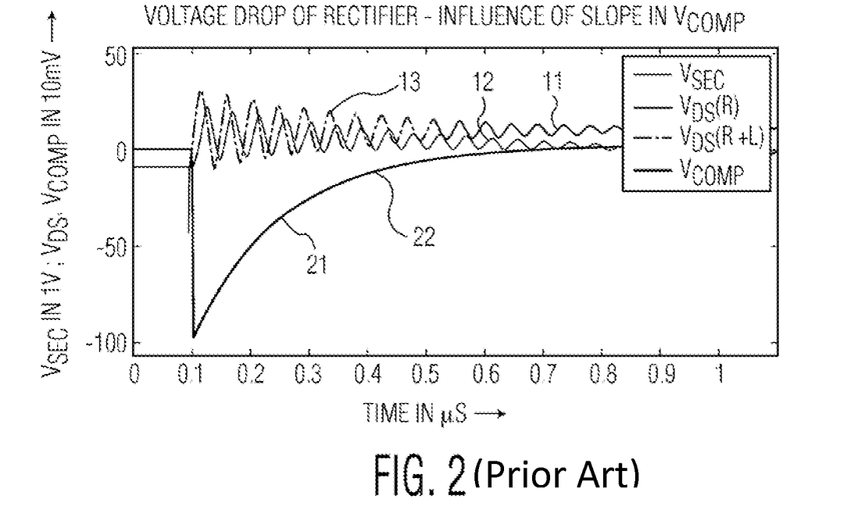
FIG. 2 shows a plot of the decaying signals of FIG. 1, and a passively-shaped comparison threshold.

In another arrangement, which is shown schematically in FIG. 2, the comparator level is a shaped over time. Thus, instead of having a fixed threshold level (such as 10-40 mV, the threshold is shaped, to be negative initially and decay exponentially towards a small positive value, as shown at 21. Alternatively, a simple RC filter can be applied to the drain-source switch voltage. However, such passive filtering is readily relatively in-flexible, and there remains a desire for better control of the switch-off moment.

SUMMARY

According to the present invention there is provided a method of controlling a synchronous rectifier having an input signal having oscillations therein and a switch which is switchable between an open state and a closed state, the method comprising filtering the input signal to produce a filtered signal, comparing the filtered signal with a reference value, and opening the switch in response to the comparison, in which the filtering is active filtering. Provision of active filtering allows for very accurate determination of the zero crossing of the rectifying current (as it would have been, without any superimposed oscillations). It should be noted that passing a very low threshold of the input signal (which is the sensed voltage across the switch) may be considered as a proxy for zero crossing of the currents; hereinafter the two terms will be used interchangeably.

In embodiments the method further comprises determining a series of values corresponding to the positive peaks of the oscillations, and generating the filtered signal in dependence on the values.

In other embodiments the method further comprises determining a series of values corresponding to the average of a positive peak of the oscillations and at least one neighbouring negative peak of the oscillations, and generating the filtered signal in dependence on the values.

Generating the filtered signal may comprise sampling the signal and holding the values. Alternatively, but without limitation, it may comprise superimposing a decay with a predetermined time-constant onto the values.

In embodiments, the method may comprise determining the period of the oscillations and generating the filtered signal by sampling and holding the input signal, at moments following each positive peak by one-quarter the period. In other embodiments, the method may comprise determining negative peaks of the oscillations, and generating the filtered signal from the average of a neighbouring positive peak and at least one neighbouring negative peak. The skilled person will appreciate that "one-quarter" should be read purposively, as should other values herein, and encompasses values which are substantially equal to one-quarter In embodiments the filtering comprises smoothing the input signal.

The filtering may comprise determining the period of the oscillations, and integrating the input signal over a period substantially equal to a multiple of the period to produce the filtered signal.

In other embodiments, the filtering may comprise smoothing the input signal by means of a switchable low-pass filter which is switched to be off for the same interval that the switch is open. The low-pass filter may be a first-order filter. In other embodiments, the filter may be a higher order low-pass filter.

According to another aspect of the present invention, there is provided a computer program, which when implemented on a computer, operates a method according to any preceding claim.

These and other aspects of the invention will be apparent from, and elucidated with reference to, the embodiments described hereinafter.

BRIEF DESCRIPTION OF DRAWINGS

Embodiments of the invention will be described, by way of example only, with reference to the drawings, in which.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION

Figure 3:
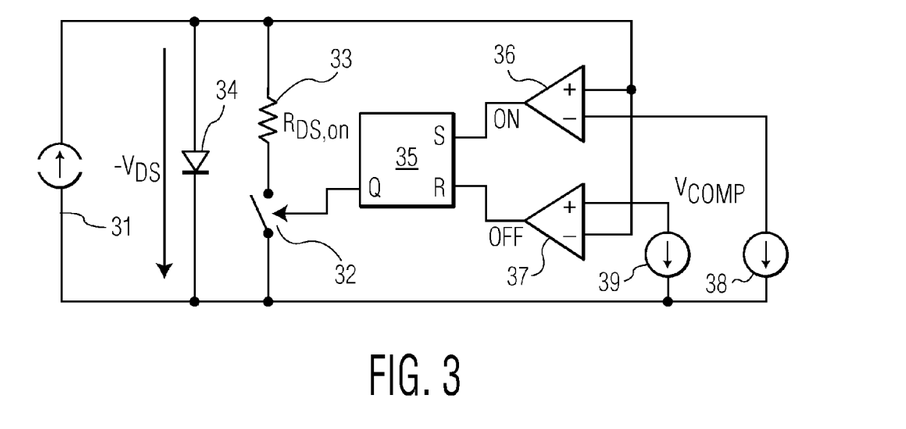
FIG. 3 shows a schematic circuit of a synchronous rectifier.

A simplified schematic circuit diagram for controlling a synchronous rectifier is shown in FIG. 3. The input, which may be modelled as a current source 31, is applied across a switch, and a diode. As shown, the switch and diode may be integral in a MOSFET device, the switch 32 being characterised by having an on-resistance $R_{DS,on}$ shown at 33, and the diode being the MOSFET's body diode shown at 34. The switch is controlled by a set-reset (RS) flip-flop 35, which is connected to two comparators 36 and 37. One comparator 36 is used to switch the switch on via the set input S to the flip-flop 35, and the other comparator is used to switch the switch off via the reset input R of flip-flop 35. The comparators compare the drain source voltage across the switch $V_{DS}$ with respective threshold values 38 and 39, which may be for instance as shown at 0.3 V for the switch on the comparator and 10-40 mV for the switch of comparator. In addition to the components shown, a practical circuit typically includes additional circuitry to provide leading edge blanking and/or maximum on-time, for suppressing of turn-off chattering, etc.

Figure 4:
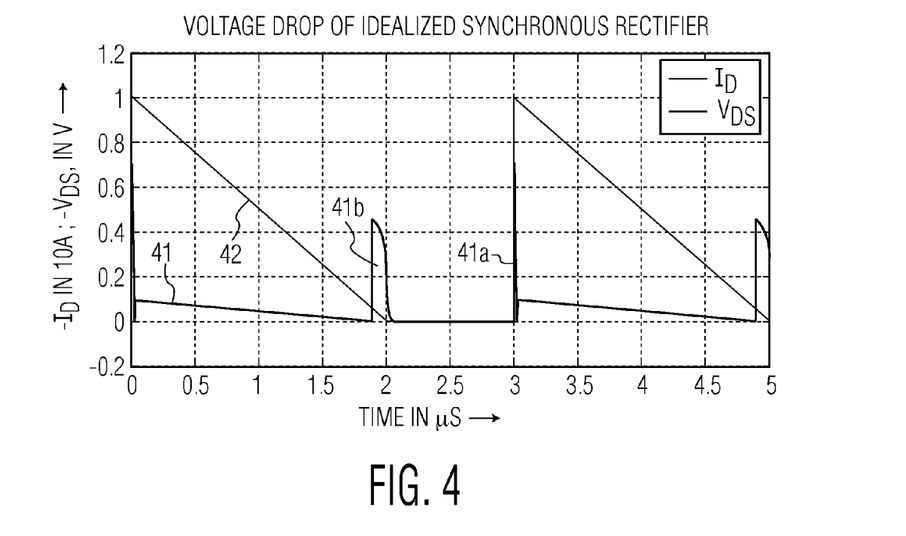
FIG. 4 shows an idealised graph of the current and voltage across a synchronous rectifier.

FIG. 4 shows the operation of the schematic circuit of FIG. 3 in case of the ideal wave-shape of a flyback converter. Line 42 depicts the secondary side current while 41 depicts the corresponding voltage across the drain-source connection of the synchronous rectifier MOSFET. 41a shows the positive going edge of the drain-source voltage (usually this voltage starts at strongly negative values (primary side voltage divided by the turns ratio), for simplification this is reduced to an ideal current source in the simulation). Since in this ideal situation a pure triangular current waveform without oscillation is assumed, this simple circuit explaining the principal behaviour of a synchronous rectifier works perfectly.

As shown in FIG. 4, the current commutates from the primary side very rapidly. This can be detected by the voltage change across the synchronous rectifier switch starting from high negative values towards the conduction voltage of the body diode. This transient 41a while the switch is still open and the body diode might conduct should be kept as short as possible by closing the switch (that is, switching it on) in time. Once the switch is on the voltage across the switch follows a substantially triangular shape. After reaching the turn-off threshold FIG. 4 depicts a transient 41b at the moment of switch-off. This latter transient 41b is less significant, though undesirable. It could be minimised by setting a negative threshold, although with a negative threshold the instant of switch-off will be too late, and energy will be transferred back to the primary side. In some scenarios this can be helpful (leading to zero-voltage-switching at the primary side).

However, in the presence of oscillations or ringings due to parasitic reactance, the zero crossing of the current (or rather, the "real" passing of the low threshold (such as 10-40 mV) for the drain-source voltage, once the effect of the oscillations is stripped away) is difficult if not impossible to determine accurately by known means.

Figure 5:
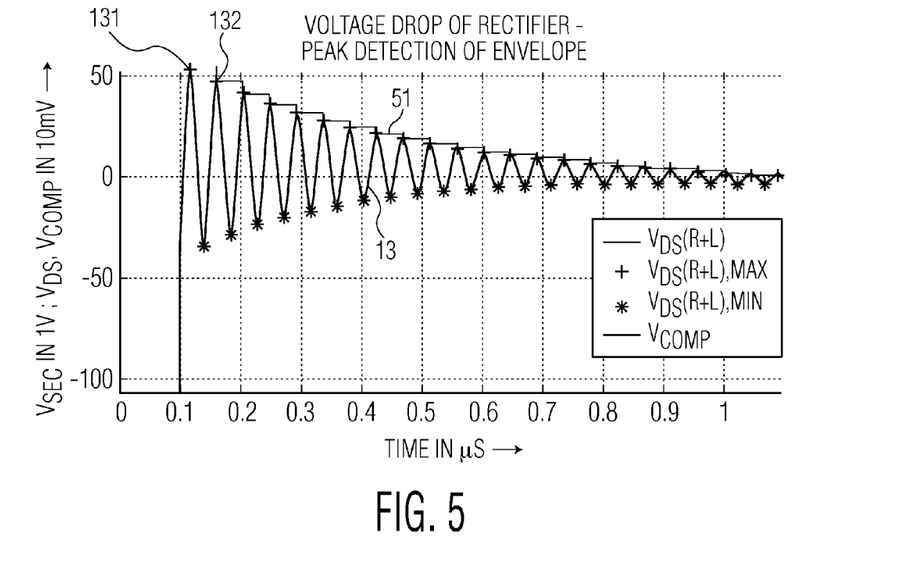
FIG. 5 shows a sample-and-hold filtering of the voltage across a synchronous rectifier.

In embodiments of the invention, this is achieved by providing active filtering of the input signal. This can be done in several different ways. In a first group of embodiments, the active filtering is carried out by determining an envelope of the voltage signal. For example, the last peak of the voltage signal may be taken as an indication of the actual voltage across the synchronous rectifier switch (and thus the current through the switch). This approach is most appropriate where the damping is adequate to ensure the oscillations are low enough to yield a switch off signal, which is not too late. A first instantiation of such technique is illustrated in FIG. 5. This figure shows the input signal 13. The peaks of the input signal 131, at 132 etc are determined, for instance by digitally sampling the signal, and a sample and hold circuit is used to create the filtered signal 51. The peak detection must be retriggered after a minimum time has elapsed; thus, in principle, both polarities should be checked, or the detection circuit is retriggered after a certain time such as between one-quarter and three-quarters of the oscillation period.

In a variant of this method, the period of the ringing is detected, for instance by measuring the first two positive peaks, or neighbouring positive and negative peaks; thereafter, the peaks of the signal is detected and the drain source voltage measured at one quarter of a ringing period after each successive positive peak. (Note that since the ringing in current has identical frequency to that in voltage, current could be measured here in instead of voltage. This will ensure detection of the value close to the zero crossing of the ringing, and thus effectively cancel out the ringing.

Figure 6:
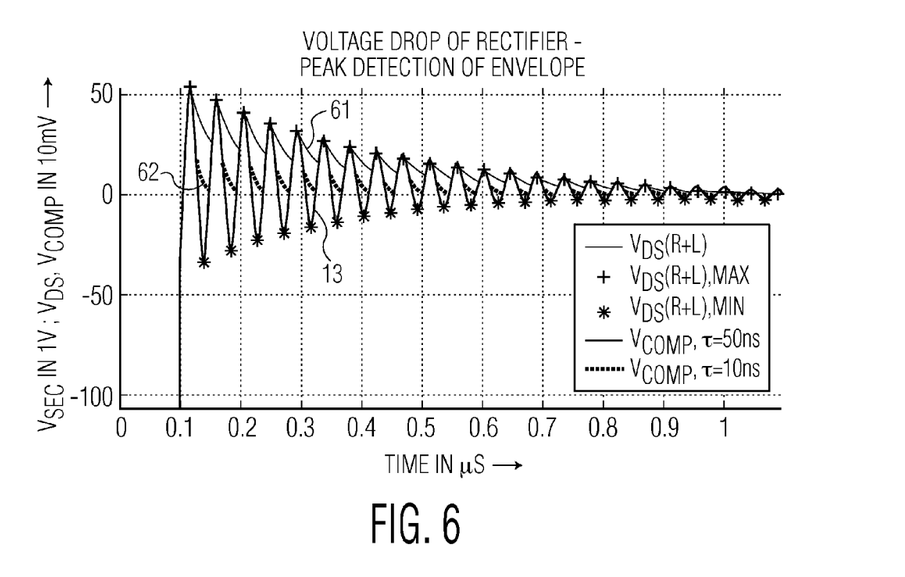
FIG. 6 shows a sample-and-decay filtering of the voltage across a synchronous rectifier.

In a further variant of the method, the positive peaks are detected as above, and then an envelope signal is generated from the positive peaks by addition of a decay, having either a fixed or an adaptable time constant. This is shown in FIG. 6, which shows a graph of the signal, 13, the positive peaks of which are measured, and then a decay added to provide the envelope signal. The figure shows two such filtered signals, the first 61 having a 50 ns decay time constant, and the second 62 having a 10 ns decay time constant. As can be seen from the figure, choice of the time constant has a significant impact on the shape of the filtered signal and should be related to the ringing frequency, in order to avoid too-early detection (with too-small a time constant), as illustrated by the 10 ns time constant shown in the figure, or too-late detection (with too-large a time constant). It is noted that this variant is convenient for manufacturing, and involves less signal processing (if embodied in a digital domain), or fewer components (if embodied in an analog domain) than those described above. For instance, in the analog domain, the filtering may be implemented by a peak detection circuit consisting of an active switching device such as a fast diode, followed by a parallel combination of a resistor and capacitor. Alternatively, instead of a resistor, the discharge or reset of the peak detection is possible using a current source; in order to adapt the slope of the discharge the current can be made dependent on the peak or actual capacitor voltage.

Figure 7:
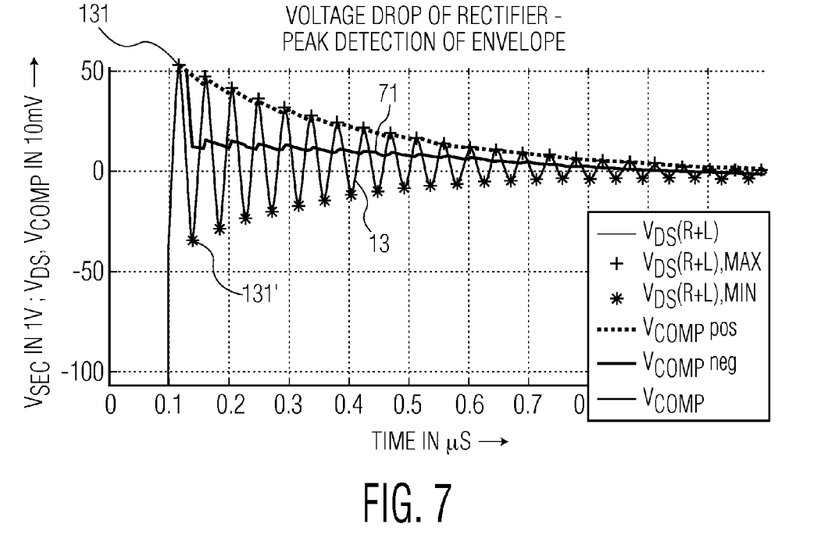
FIG. 7 shows filtering of the voltage across a synchronous rectifier by means of averaging neighbouring peaks.

Other embodiments, which are closely related to those already described, rely on envelope detection using both positive and negative peaks of the ringing. In these embodiments, both waveforms are added, resulting in a signal which follows closely the real voltage across the switch absent any superimposed oscillation. This can result in the detection of zero crossing (or, in practice, crossing the very small threshold voltage) with a high accuracy. A simulation of such a method, applied in conjunction with a fixed time constant of the decay, is shown in FIG. 7. Successive positive and negative peaks 131 and 131' are measured, and the average of the two is used to determine starting value for the filtered signal 71, which is then allowed to decay, in this case with a time constant of 200 ns. With each successive positive or negative peak the signal is updated. As a result the waveform 71 clearly shows a detectable zero crossing which is located close to the zero-crossing of the current through the synchronous rectifier. The skilled person will appreciate that "zero-crossing" could, in the alternative, refer to the crossing of a small positive or small negative, non-zero, threshold value.

Figure 8:
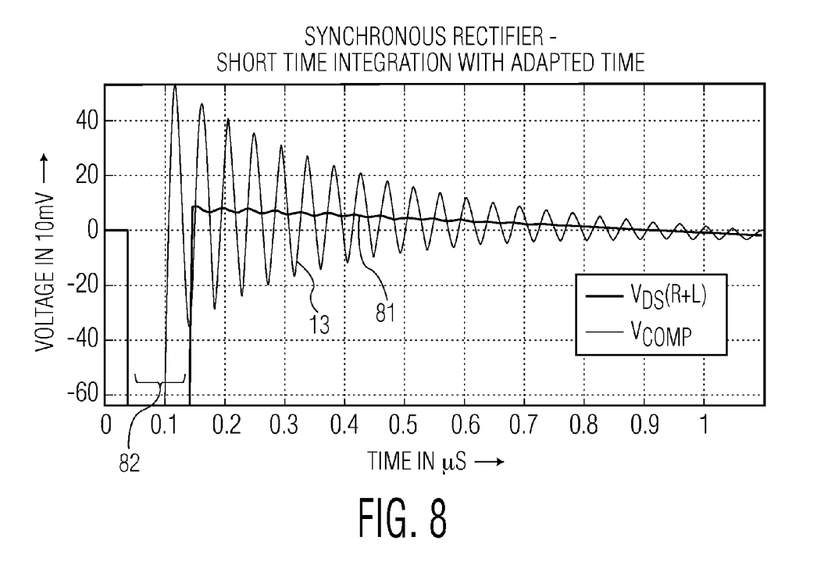
FIG. 8 shows filtering of the voltage across a synchronous rectifier by means of a short-period integration.

In other embodiments, the input signal is actively smoothed. In a first one of these, a short time integrator is used on the input voltage. The effect of this is to insert a notch in the transfer function at frequencies corresponding to the integration time. For a complete suppression of the parasitic oscillation, its frequency must be detected, for instance by peak-to-peak detection or by detection of a first few zero-crossings, and the integration time adapted to match. With perfect matching, the oscillation would be completely removed from the signal. This is shown in the simulation of FIG. 8, where the input signal 13 is filtered as just described to produce the smoothed and almost ripple-free signal 81, after an initial calculation period 82. This approach is operable even with a slightly detuned integration time, albeit with slightly worse ripple on the signal. To get the very best performance, a control loop may be included in order to adapt the integration time to minimise the ripple.

Figure 9:
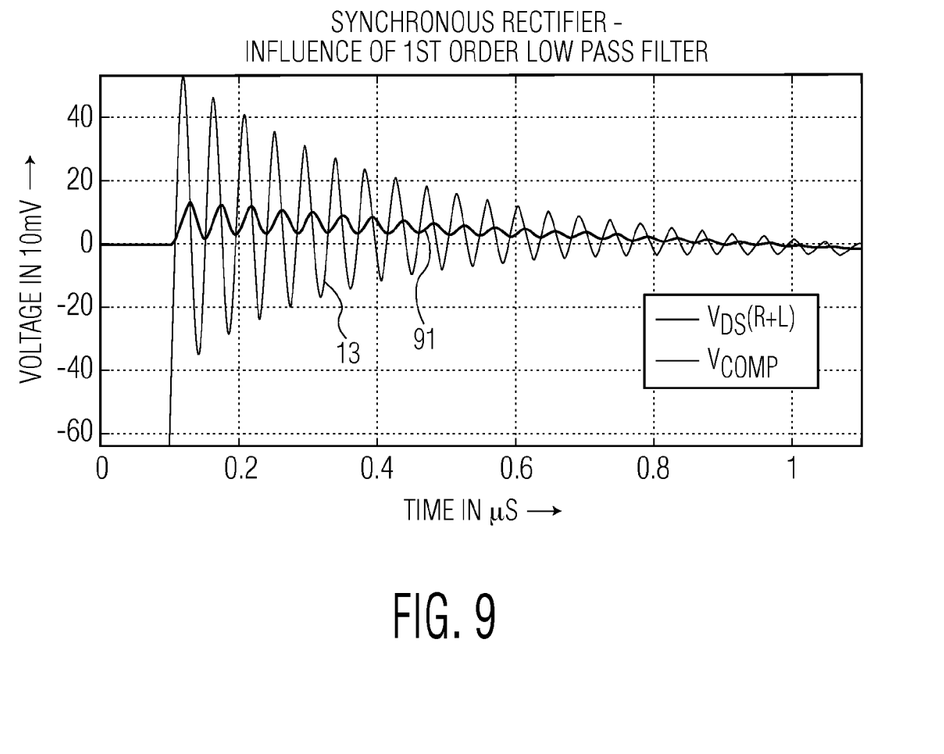
FIG. 9 shows a filtering of the voltage across a synchronous rectifier by means of a switched low-pass-filter.

A further embodiment in which the active filtering is carried out by smoothing the input signal, involves use of a switched low pass filter. The low pass filter would require to be switched in order to prevent the filter from saturation by the negative blocking voltage of the synchronous rectifier. In particular, the filter is switched out for the time period during which the blocking voltage is applied at the synchronous rectifier (in the case of a flyback converter, that is to say, during the primary stroke). A simple first-order RC filter maybe used for this application; however, a more accurate results may be obtained by using higher-order filters such as a second-order LC filter or a third-order CLC filter. Moreover, the time constant of the low pass filter may be adapted for instance by use of controllable external components, in order to improve the response. An example of such a filter signal is shown in FIG. 9. Once more, compared to the input signal 13, the low pass filtered signal 91 shows far less ringing, and may result in the accurate zero-crossing determination.

Figure 10:
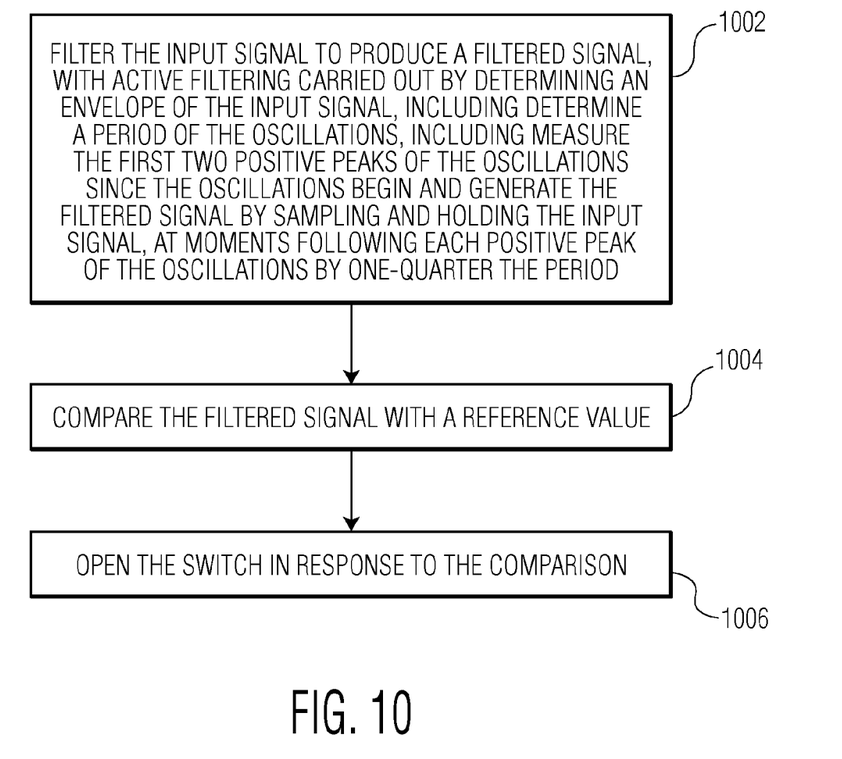
FIG. 10 is a process flow diagram that illustrates a method for controlling a synchronous rectifier in accordance with an embodiment of the invention.

FIG. 10 is a process flow diagram that illustrates a method for controlling a synchronous rectifier in accordance with an embodiment of the invention. The synchronous rectifier has an input signal having oscillations therein and a switch which is switchable between an open state and a closed state. At block 1002, the input signal is filtered to produce a filtered signal in which the filtering is active filtering carried out by determining an envelope of the input signal. A period of the oscillations is determined by measuring the first two positive peaks of the oscillations since the oscillations begin. The filtered signal is generated by sampling and holding the input signal, at moments following each positive peak of the oscillations by one-quarter the period. At block 1004, the filtered signal is compared with a reference value. At block 1006, the switch is opened in response to the comparison.

Figure 11:
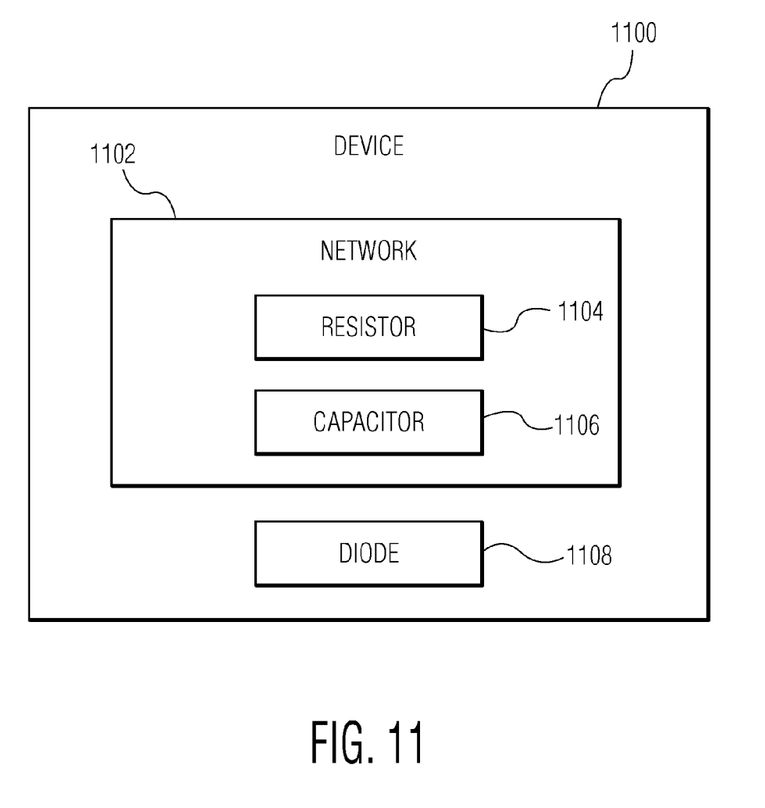
FIG. 11 depicts an embodiment of a device for producing a decay with a predetermined time-constant.

FIG. 11 depicts an embodiment of a device 1100 for producing a decay with a predetermined time-constant. In the embodiment depicted in FIG. 11, the device includes a network 1102 that includes a resistor 1104 and a capacitor 1106, and a diode 1108.

The embodiments above have been described with reference to a single switch at the primary side. An example of a power converter of employing a single switch at the primary side is a flyback converter, which is typically implemented with a single MOSFET as synchronous rectifier at the secondary side for each output voltage, and the above-described embodiments have been described in related to a fly-back converter operating in BCM (Boundary Conduction) or DCM (Discontinuous Conduction) mode. However, the invention is not so limited, and may be applied with, for instance, each of two/four switches used as synchronous rectifiers for converter configurations such as half-bridge or full-bridge converters which employ two/four switches for full wave rectification. Furthermore, the invention is not limited to a specific type of converter, but can also be used, without limitation, for resonant converters such as LLC, LCC and series and parallel resonant converters.

Due to increased recent and ongoing pressure to improve the efficiency of power converters, the invention may beneficially be used in a wide range of applications, which currently employ rectifier diodes with power converters operating in discontinuous conduction mode or boundary conduction mode. In particular, it will find particular application in low- and mid-powered equipment, where a flyback or a resonant converter is used in the supply. These include, without limitation, adapters for mobile devices such as notebooks, battery chargers and the like, and consumer products such as TV sets, set-top boxes, DVD-recorders and the like.

In summary, seen from one viewpoint, there has been disclosed a method of controlling a synchronous rectifier having an input signal disturbed by oscillations therein and a switch which is switchable between an open state and a closed state, the method comprising filtering the input signal to produce a filtered signal, comparing the filtered signal with a reference value, and opening the switch in response to the comparison, in which the filtering is active filtering. The active filtering may be based on determination of the peaks (positive and/or negative) of the signal, either directly, including a quarter period offset, or including decay—or a combination of the above; alternatively, the active filtering may be based on smoothing functions such as a switched low-pass filter or a short time integrator.

From reading the present disclosure, other variations and modifications will be apparent to the skilled person. Such variations and modifications may involve equivalent and other features which are already known in the art of synchronous rectification, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

As used herein, the term "computer program" is to be construed to embrace any set of instructions, which can be implemented on a machine, and "computer" similarly includes any device which is capable of executing a set of instructions, and thus embraces without limitation microprocessors, programmable logic controllers, programmable read-only memories, and the like.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A method of controlling a synchronous rectifier having an input signal having oscillations therein and a switch which is switchable between an open state and a closed state, the method comprising
    filtering the input signal to produce a filtered signal,
    comparing the filtered signal with a reference value, and
    opening the switch in response to the comparison,
    wherein filtering the input signal comprises:
        determining a period of the oscillations, comprising measuring the first two positive peaks of the oscillations since the oscillations begin, and
        generating the filtered signal by sampling and holding the input signal, at moments following each positive peak of the oscillations by one-quarter the period,
    in which the filtering is active filtering carried out by determining an envelope of the input signal.

2. The method of claim 1 comprising
    determining a series of values corresponding to positive peaks of the oscillations, and
    generating the filtered signal in dependence on the values.

3. The method of claim 2 comprising generating the filtered signal by sampling the input signal and holding the values.

4. The method of claim 2 comprising generating the filtered signal by
    superimposing a decay with a predetermined time-constant onto the values.

5. The method of claim 4, wherein the decay is produced by a network comprising a resistor and a capacitor, together with a diode.

6. The method of claim 2 comprising determining negative peaks of the oscillations, and generating the filtered signal from an average of a neighbouring positive peak and at least one neighbouring negative peak.

7. The method of claim 1 comprising
    determining a series of values corresponding to an average of a positive peak of the oscillations and at least one neighbouring negative peak of the oscillations, and
    generating the filtered signal in dependence on the values.

8. The method of claim 7 comprising generating the filtered signal by sampling the input signal and holding the values.

9. The method of claim 7 comprising generating the filtered signal by
    superimposing a decay with a predetermined time-constant onto the values.

10. A method as claimed in claim 1 wherein the filtering comprises smoothing the input signal.

11. A method as claimed in claim 10, wherein the filtering comprises
    integrating the input signal over a period substantially equal to a multiple of the period to produce the filtered signal.

12. A method as claimed in claim 10, comprising smoothing the input signal by means of a switchable low-pass filter which is switched to be off for the same interval that the switch is open.

13. A method as claimed in claim 12, wherein the low-pass filter is a first-order filter.

* * * * *